(12) United States Patent
Feurle

(10) Patent No.: US 6,433,617 B1
(45) Date of Patent: Aug. 13, 2002

(54) CONFIGURATION FOR REDUCING THE NUMBER OF MEASURING PADS ON A SEMICONDUCTOR CHIP

(75) Inventor: Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 5 days.

(21) Appl. No.: 09/672,625

(22) Filed: Sep. 28, 2000

(30) Foreign Application Priority Data

Sep. 28, 1999  (DE) .......................................... 199 46 495

(51) Int. Cl.$^7$ ............................................... H01H 85/00
(52) U.S. Cl. ........................................ 327/525; 327/526
(58) Field of Search ................................. 327/525, 526; 365/200, 201, 225.7

(56) References Cited

U.S. PATENT DOCUMENTS 6,014,050 A  *  1/2000  McClure ..................... 327/281

* cited by examiner

*Primary Examiner*—Kenneth B. Wells
(74) *Attorney, Agent, or Firm*—Laurence A. Greenberg; Werner H. Stemer; Gregory L. Mayback

(57) ABSTRACT

The invention relates to a configuration for reducing the number of pads on a semiconductor chip (1) with an integrated circuit. This configuration includes an analog/digital converter (3), which feeds internal voltages that are delivered by different locations (2) in the integrated circuit via a pad (9) to a fuse cutter (5), which then blows fuses (7) in order to bring the measured internal voltages into accord with target values.

4 Claims, 1 Drawing Sheet

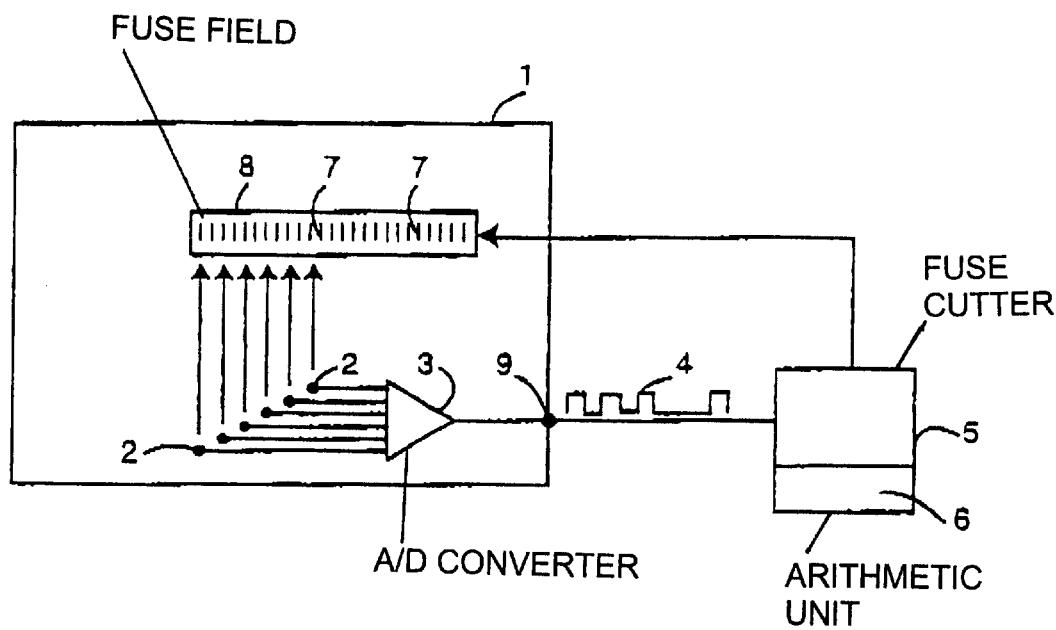

CONFIGURATION FOR REDUCING THE NUMBER OF MEASURING PADS ON A SEMICONDUCTOR CHIP

BACKGROUND OF THE INVENTION

Field of the Invention

The invention relates to a configuration for reducing the number of measuring pads (or measuring contact pads) on a semiconductor chip that contains an integrated circuit, wherein fuses are blown in the semiconductor chip for the purpose of setting internal electrical voltages.

In an existing configuration, when a semiconductor is tested, internal voltages that are present in the integrated circuit that is realized in a semiconductor chip are tapped at a number of measuring pads with the aid of a tester. Subsequent to comparing these internal voltages to desired values, corresponding fuses are blown using a fuse cutter (or a fuse triggering device), whereby the internal voltages are trimmed to their desired values. A typical value that can be achieved by blowing a fuse is a voltage drop of 10 mV, for example.

With this kind of procedure, it is possible to set all internal voltages in the integrated circuit relatively precisely without further ado. But this is relatively complicated, since each individual internal voltage must be assigned a separate measuring pad (as it is known), via which the value of the internal voltage is delivered externally, namely to the fuse cutter. In addition, the large number of measuring pads (also referred to as characterization pads) take up space on the semiconductor chip, which is undesirable in many cases. Besides this, in addition to the measuring pads, the semiconductor chip also has a number of input/output pads at its disposal, via which the signals are fed in and out of the integrated circuit. For this reason, it is often problematic to provide additional space for measuring pads in addition to a large number of indispensable I/O pads.

SUMMARY OF THE INVENTION

It is accordingly an object of the invention to provide a configuration for reducing the number of measuring pads on a semiconductor chip containing an integrated circuit which overcomes the hereinafore-mentioned disadvantages of the heretofore-known methods and devices of this general type in such a way that configuration fuses can be precisely blown even given few available pads.

With the foregoing and other objects in view there is provided, in accordance with the invention, a configuration for reducing the number of pads on a semiconductor chip. The configuration consists of a semiconductor chip that includes an integrated circuit and a plurality of fuses that are configured for setting internal electrical voltages in the integrated circuit. The semiconductor chip includes an input/output pad and an analog to digital converter for digitizing values of the internal electrical voltages and for providing the digitized values to the input/output pad. The configuration also consists of a fuse cutter that is preferably disposed external from the semiconductor chip. The fuse cutter is configured to receive the digitized values from the input/output pad and to blow selected ones of the plurality of fuses of the semiconductor chip.

The invention thus takes a completely different approach from the prior art: using an additional analog/digital converter in the semiconductor chip, the internal voltages which are being set in the integrated circuit are digitized. The obtained digital data stream can then be outputted to the fuse cutter via an I/O pad which is already present (or several such pads, as warranted), which then acts on the semiconductor chip, blowing the fuses in such a way that the respective internal voltages assume their desired values. Instead of a plurality of separate measuring pads, one I/O pad which is already present is used to carry the digital data stream from the analog/digital converter to the fuse cutter and thus to execute the "fusing".

The analog/digital converter can be realized relatively simply in the semiconductor chip and in any case requires less space—that is to say, less area—than a plurality of measuring pads. For example, with a 6-bit analog/digital converter, six fuses can be blown accordingly.

By reducing the number of pads it is also possible to test more semiconductor chips than previously in parallel fashion. Beyond this, the trimming process for setting the internal voltages in the integrated circuit is simplified in that the measurement and calculation of the internal target voltage is ultimately transferred to the semiconductor chip itself.

Other features which are considered as characteristic for the invention are set forth in the appended claims.

Although the invention is illustrated and described herein as embodied in a configuration for reducing the number of measuring pads on a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a schematic of the inventive configuration.

DESCRIPTION OF THE PREFERRED EMBODIMENTS

Referring to the sole drawing FIGURE, there is shown a semiconductor chip 1 in which an integrated circuit is realized, and in which an internal electrical voltage is measured and adjusted to a respectively allocated internal target voltage value at several locations 2. To accomplish this, the voltage values which are measured at the locations 2 are fed to an analog/digital (A/D) converter 3, which digitizes the individual voltage values that are measured at the locations 2 and delivers a digital data stream 4 externally. This data stream 4 is fed to a fuse cutter 5 that is provided with a corresponding arithmetic unit 6 for comparing the data stream 4 containing information about the internal voltages at each location 2 to corresponding voltage values that have been provided for these locations 2. These provided voltage values are known as the internal target voltages. Depending on the result of the comparison, specific fuses 7 are then blown, which can be disposed in a fuse field 8 of the semiconductor chip 1 and allocated to individual locations 2. This process of blowing fuses 7 brings the internal voltages at the individual locations 2 closer to the target voltages, until the latter are attained with optimal precision.

The invention thus makes it possible to save a large number of measuring pads by expending the additional outlay for the analog/digital converter 3, since the output of the analog/digital converter 3 can be connected to a conventional I/O pad 9 of the integrated circuit which is realized in the semiconductor chip 1. It is also possible to use a converter which is already contained in the integrated circuit of the semiconductor chip 1 for the analog/digital converter 3. In this case, practically no additional outlay is required.

I claim:

1. A configuration for reducing the number of pads on a semiconductor chip, comprising:

a semiconductor chip including an integrated circuit and a plurality of fuses configured for setting internal electrical voltages in said integrated circuit, said semiconductor chip including an input/output pad and an analog to digital converter for digitizing values of the internal electrical voltages and for providing the digitized values to said input/output pad; and a fuse cutter disposed external from said semiconductor chip, said fuse cutter configured to receive the digitized values from said input/output pad and to blow selected ones of said plurality of fuses of the semiconductor chip.

2. The configuration according to claim 1, wherein said integrated circuit includes a plurality of locations at which the values of internal electric voltages can be obtained and provided to said analog to digital converter.

3. The configuration according to claim 1, wherein said fuse cutter includes an arithmetic unit.

4. The configuration according to claim 3, wherein said arithmetic unit is constructed to compare the internal electrical voltages with internal target voltages.

* * * * *